(12) United States Patent
Park

(10) Patent No.: US 7,785,919 B2
(45) Date of Patent: Aug. 31, 2010

(54) IMAGE SENSOR AND METHOD FOR MANUFACTURING THE SAME

(75) Inventor: Kyung Min Park, Namdong-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 55 days.

(21) Appl. No.: 12/144,748

(22) Filed: Jun. 24, 2008

(65) Prior Publication Data
US 2009/0001492 A1   Jan. 1, 2009

(30) Foreign Application Priority Data
Jun. 26, 2007   (KR) .................... 10-2007-0062677

(51) Int. Cl.
*H01L 21/00* (2006.01)
(52) U.S. Cl. ............. 438/70; 438/64; 438/69; 438/95; 438/199; 438/660; 438/761; 438/762; 438/765
(58) Field of Classification Search ........... 257/204, 257/774, E23.141, E23.142, E23.145, E27.046, 257/E27.064, E27.108, E21.632, E21.438, 257/E21.622, E21.636; 438/64, 69, 70, 95, 438/106, 199, 660, 761, 762, 765, FOR. 187, 438/FOR. 395, FOR. 397, FOR. 405
See application file for complete search history.

(56) References Cited

U.S. PATENT DOCUMENTS

| 6,117,703 | A | * | 9/2000 | Penndorf | .................... | 438/63 |
| 2006/0124948 | A1 | * | 6/2006 | Lee | ................ | 257/98 |
| 2008/0110495 | A1 | * | 5/2008 | Onodera et al. | ............. | 136/256 |
| 2008/0315185 | A1 | * | 12/2008 | Araki | .......................... | 257/40 |

FOREIGN PATENT DOCUMENTS

KR   10-2004-0046538   12/2005

OTHER PUBLICATIONS

An et al., Translation of KR 10-2004-0046538, cited in IDS filed Jul. 2, 2008, Dec. 27, 2005, pp. 1-7.*

* cited by examiner

*Primary Examiner*—N Drew Richards
*Assistant Examiner*—Joannie A Garcia
(74) *Attorney, Agent, or Firm*—Saliwanchik, Lloyd & Saliwanchik

(57) ABSTRACT

An image sensor and a method for manufacturing the same are provided. The image sensor can comprise a substrate, a metal pad, and a sulfur layer. The substrate can include a pixel region and a pad region. The metal pad can be formed of a material containing sulfur and can be disposed in the pad region of the substrate. The sulfur layer can be formed from the sulfur of the metal pad and provided on a top surface of the metal pad.

12 Claims, 3 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0062677, filed Jun. 26, 2007, which is hereby incorporated by reference in its entirety.

BACKGROUND

In a typical process for manufacturing a complementary metal oxide silicon (CMOS) image sensor (CIS), a color filter and a microlens are manufactured after a metal pad is exposed for packaging. This leads to exposure of the metal pad to developer, which can often cause metal corrosion on the metal pad from chemicals used during manufacture of the color filter and microlens.

Thus, there exists a need in the art for an improved image sensor and method of manufacturing the same.

BRIEF SUMMARY

Embodiments of the present invention provide an image sensor that can inhibit corrosion of a metal pad and a method for manufacturing the image sensor.

In one embodiment, an image sensor comprises: a substrate having a pixel region and a pad region; a metal pad on the pad region of the substrate, the metal pad comprising sulfur; and a sulfur layer on the metal pad.

A method for manufacturing an image sensor according to an embodiment comprises: providing a substrate having a pixel region and a pad region; forming a metal pad on the pad region of the substrate, where the metal pad comprises sulfur; and heat-treating the substrate to form a sulfur layer on the metal pad.

The details of one or more embodiments are set forth in the accompanying drawings and the description below. Other features will be apparent from the description and drawings, and from the claims.

DETAILED DESCRIPTION

Hereinafter, an image sensor and a method for manufacturing the same will be described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
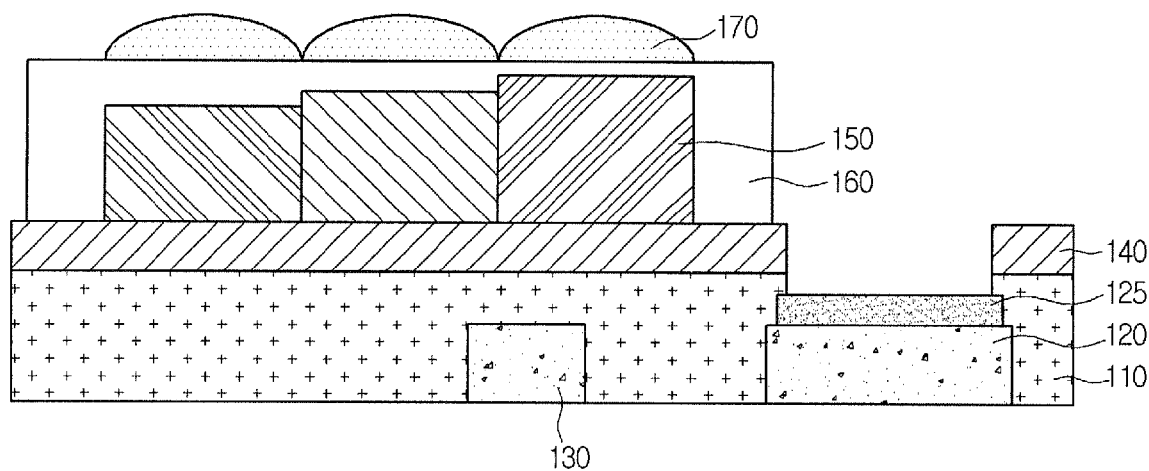
FIG. 1 is a cross-sectional view of an image sensor according to an embodiment of the present invention.

FIG. 1 is a cross-sectional view of an image sensor according to an embodiment of the present invention.

Referring to FIG. 1, in an embodiment, an image sensor can include a substrate 110, a metal pad 120, a sulfur layer 125, and a color filter 150. The substrate 110 can include a pixel region and a pad region. The metal pad 120 can contain sulfur (S) and can be disposed on the pad region of the substrate 110. The sulfur layer 125 can be disposed on the metal pad 120, and the color filter 150 can be disposed on the pixel region of the substrate 110. According to an embodiment, the sulfur layer 125 is disposed on an upper portion of the metal pad 120.

In an embodiment, the image sensor can also include a microlens 170 disposed on the color filter 150, an upper metal interconnection 130 in the pixel region, a passivation layer 140 in the pixel region and the pad region, and/or a planarization layer 160 in the pixel region. In addition, although not illustrated in the figures, persons of ordinary skill in the art will appreciate that the substrate 110 can include structures such as metal interconnects, interlayer dielectric layers, transistors, diffusion regions, and so forth.

Since the sulfur layer 125 can be disposed on the metal pad 120, corrosion of the metal pad 120 caused by a developer can be inhibited during a manufacturing process of the color filter 150 and/or the microlens 170.

In an embodiment, the metal pad 120 can contain sulfur. In one embodiment, the metal pad 120 can have a chemical composition of CuAlS.

In an embodiment, the sulfur layer 125 can have a monolayer structure on the metal pad 120.

In an alternative embodiment, the sulfur layer 125 can have a multilayer structure on the metal pad 120.

A method for manufacturing an image sensor according to an embodiment of the present invention will now be described with reference to FIGS. 2 to 5.

Figure 2:
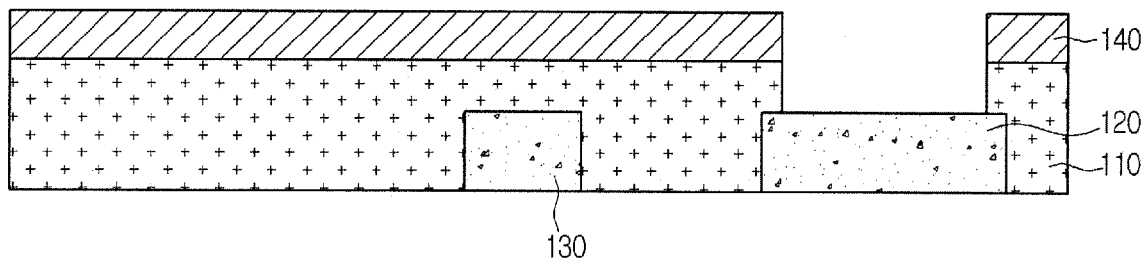
FIGS. 2 to 5 are cross-sectional views of a process for manufacturing an image sensor according to an embodiment of the present invention.

Referring to FIG. 2, a substrate 110 including a pixel region and a pad region can be provided. As discussed above, a person of ordinary skill in the art would appreciate that the substrate 110 can include additional structures for the image sensor.

A metal pad 120 formed of a material containing sulfur (S) can be formed in the pad region of the substrate 110. In addition, an upper metal interconnection 130 can be formed in the pixel region of the substrate 110.

In one embodiment, the metal pad 120 can be formed by adding sulfur to a metal pad target. The metal pad 120 can be formed by, for example, adding about 0.5% to about 4% by weight of sulfur to the metal pad target. When sulfur content is less than about 0.5% by weight, it can be difficult to initiate segregation of sulfur into a sulfur layer. When the sulfur content is more than about 4% by weight, the electrical conductivity of the metal pad 120 can be inhibited.

In a particular embodiment, the metal pad 120 containing sulfur can have a chemical composition of CuAlS. This can be accomplished by adding sulfur to a Cu—Al metal pad target.

For example, the metal pad 120 can have a chemical composition of about 0.5% Cu, X % S (where $0.5 \leq X \leq 4$) by weight and the rest Al and can be formed using a metal target.

The metal target can be formed by adding sulfur ranging from about 0.5% to about 4% by weight to a metal target made up of about 0.5% Cu and the rest Al (an Al pad).

In one embodiment, a passivation layer 140 can be formed on the substrate 110 including the metal pad 120. The passivation layer 140 can include a nitride layer or an oxide layer. The passivation layer 140 can be formed of any suitable material known in the art, for example, silicon nitride (SiN).

A process can be performed to expose the metal pad 120, as illustrated in FIG. 2.

Figure 3:
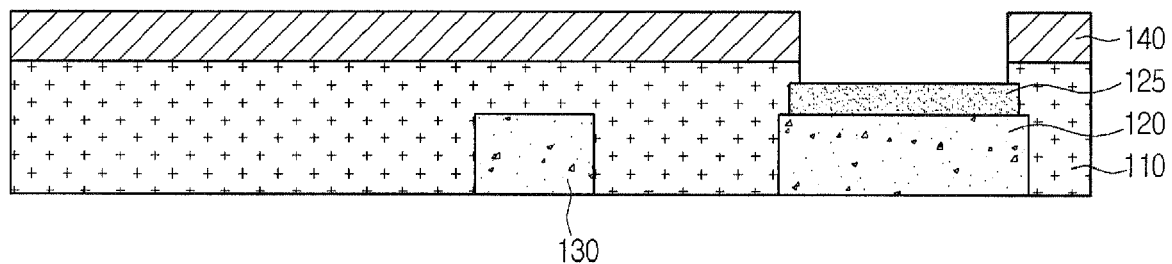

Referring to FIG. 3, the substrate 110 including the metal pad 120 can be heat-treated to form a sulfur layer 125 on the metal pad 120.

In the forming of the sulfur layer 125 on the metal pad 120, the substrate 110 including the metal pad 120 can be heat-treated to segregate sulfur to a surface of the metal pad 120.

In one embodiment, the substrate 100 including the metal pad 120 can be heat-treated to form the sulfur layer 125 having a monolayer structure on the surface of the metal pad 120.

In an alternative embodiment, the substrate 110 including the metal pad 120 can be heat-treated two or more times to form the sulfur layer 125 having a multilayer structure on the surface of the metal pad 120.

According to an embodiment, the substrate 110 including the metal pad 120 can be heat-treated at a temperature ranging from about 100° C. to about 300° C. to form the sulfur layer 125 on the surface of the metal pad 120. When the substrate 110 is heat-treated at a temperature less than about 100° C., it can be difficult to initiate segregation of sulfur. When the substrate 110 is heat-treated at a temperature more than about 300° C., the metal pad 120 can be overheated.

In certain embodiments, the substrate 110 including the metal pad 120 can be heat-treated for a period of time about 1 minute to about 30 minutes to form the sulfur layer 125 on the surface of the metal pad 120. When the substrate 110 is heat-treated for less than about 1 minute, it can be difficult to initiate segregation of sulfur. When the substrate 110 is heat-treated for more than about 30 minutes, the substrate 110 can be thermally degraded.

When the metal pad 120 containing sulfur is heat-treated, sulfur in the metal pad can be segregated to a thermodynamically stable surface to form the sulfur layer 125.

Once the sulfur layer 125 having a monolayer or multilayer structure is formed on the surface of the metal pad 120, movement of the sulfur to the surface of the metal pad 120 can stop. The sulfur layer 125 formed on the metal pad 120 is relatively resistant to chemicals compared to metal and can help inhibit metal corrosion of the metal pad 120.

Therefore, the metal pad 120 on which the sulfur layer 125 is formed has excellent corrosion resistance characteristics compared to a related art, exposed metal pad.

Figure 4:
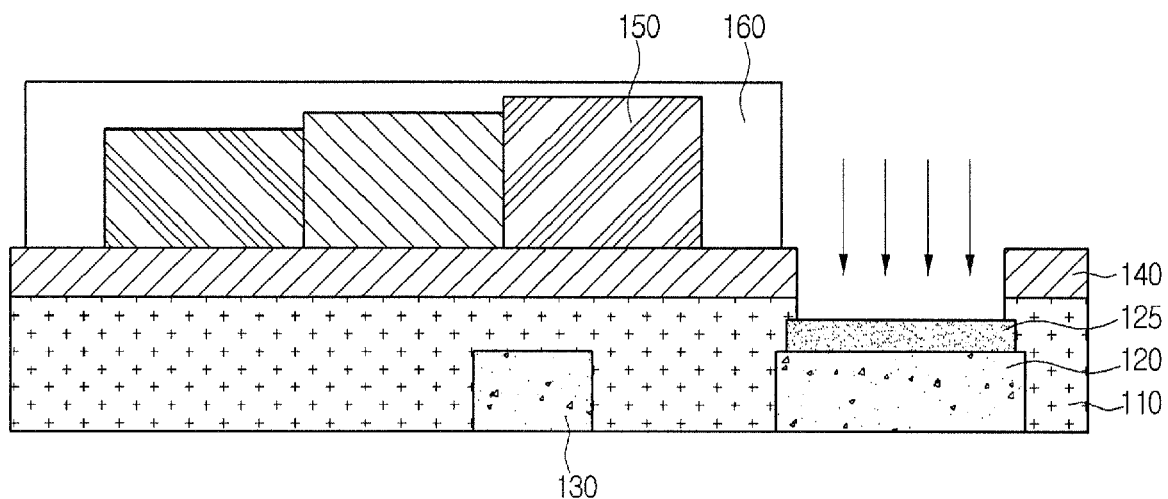

Referring to FIG. 4, a color filter 150 can be formed in the pixel region of the substrate 110.

The color filer 150 can be formed using any suitable process known in the art. For example, a dyeable resist can be coated on the passivation layer 140, and exposing and developing processes can be performed thereon to form color filters (e.g., red, green, and blue) which can filter light of different wavelength bands.

In one embodiment, a planarization layer 160 can be formed on the color filter layer 150 to obtain planarization for focal length adjustment and formation of a lens layer.

Figure 5:
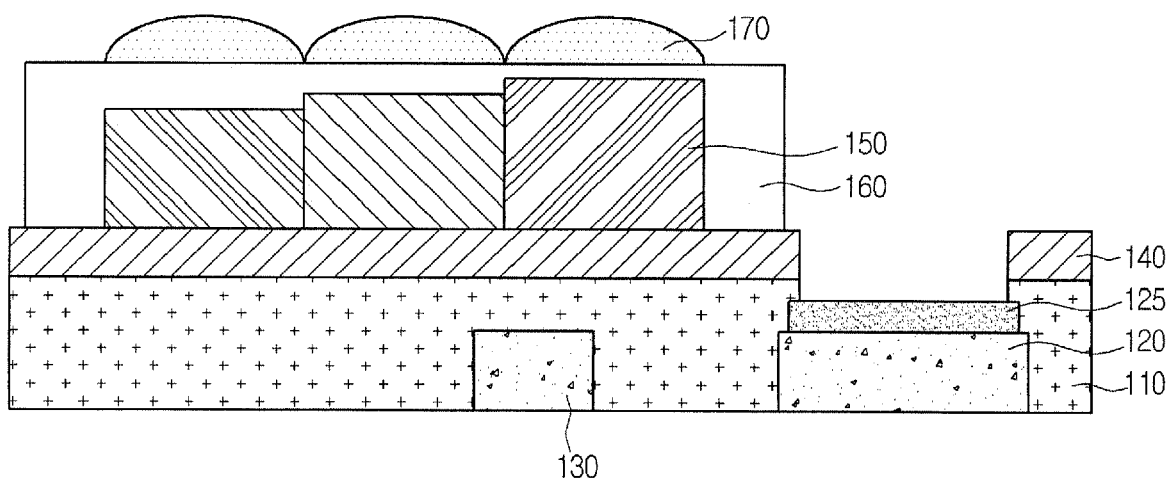

Referring to FIG. 5, in a further embodiment, a microlens 170 can be formed on the color filter 150.

Embodiments of the present invention can inhibit corrosion of the metal pad 120 during the manufacturing process of the color filter 150 and/or the microlens 170 because the sulfur layer 125 is disposed on the metal pad 120.

In one embodiment, the sulfur layer 125 can be removed through a metal strip process to expose the metal pad 120, and a wire bonding process and a packaging process can be performed.

The sulfur layer 125 can be removed by any suitable process known in the art, for example, by wet etching using hydrogen fluoride (HF) solution.

In certain embodiments, the sulfur layer 125 may not be removed.

In the image sensor and the method for manufacturing the same according to embodiments of the present invention, the sulfur layer can be formed on the metal pad, thereby inhibiting corrosion of the metal pad that could be caused by the developer during the manufacturing process of the color filter and/or the microlens.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
   providing a substrate comprising a pixel region and a pad region;
   forming a metal pad on the pad region of the substrate; and
   heat-treating the substrate to form a sulfur layer on the metal pad;
   wherein forming the metal pad comprises adding about 0.5% to about 4% by weight of sulfur to the metal pad target.

2. The method according to claim 1, further comprising forming a color filter in the pixel region of the substrate.

3. The method according to claim 2, further comprising removing the sulfur layer through a metal strip process after forming the color filter.

4. The method according to claim 2, further comprising forming a microlens on the color filter.

5. The method according to claim 1, wherein forming the metal pad comprises adding sulfur to a metal pad target.

6. The method according to claim 5, wherein the metal pad target comprises copper and aluminum.

7. The method according to claim 1, wherein the metal pad comprises CuAlS.

8. The method according to claim 1, wherein sulfur is segregated to a surface of the metal pad during the heat-treating of the substrate.

9. The method according to claim 1, wherein the sulfur layer has a monolayer structure.

10. The method according to claim 1, further comprising heat-treating the substrate a second time to form the sulfur layer with a multilayer structure.

11. The method according to claim 1, wherein heat-treating the substrate comprises heat-treating the substrate at a temperature ranging from about 100° C. to about 300° C.

12. The method according to claim 1, wherein heat-treating the substrate comprises heat-treating the substrate for a period of time of about 1 minute to about 30 minutes.

* * * * *